United States Patent
Wu (10) Patent No.: US 6,319,030 B1
(45) Date of Patent: Nov. 20, 2001

(54) SWITCHING RECEPTACLE CONNECTOR

(75) Inventor: Kun-Tsan Wu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/493,027

(22) Filed: Jan. 27, 2000

(30) Foreign Application Priority Data

Dec. 23, 1999 (TW) .................................................. 88221947

(51) Int. Cl.⁷ .................................................. H01R 29/00
(52) U.S. Cl. ............................................ 439/188; 439/668
(58) Field of Search ................................... 439/188, 668, 439/669

(56) References Cited

U.S. PATENT DOCUMENTS

| | | | |
|---|---|---|---|
| 4,364,625 | * 12/1982 | Baker et al. | 439/669 |
| 4,367,907 | * 1/1983 | Buck | 439/188 |
| 4,867,708 | * 9/1989 | Iizuka | 439/669 |
| 5,022,872 | * 6/1991 | Shichida | 439/668 |
| 5,893,767 | * 4/1999 | Broschard, III | 439/188 |

* cited by examiner

*Primary Examiner*—Gary Paumen
(74) *Attorney, Agent, or Firm*—Wei Te Chung (57) ABSTRACT

A switching receptacle connector comprises an insulative housing and a plurality of substantially same pairs of switch contacts retained within the housing. The housing defines a longitudinal mating opening for extension of a mating plug terminal and a plurality of receiving slots in communication with the mating opening for receiving the corresponding switch contacts. Each pair of contacts includes a first contact and a second contact. Each first contact has a first soldering section, a first retaining section for engaging with the housing, and an abutting section for abutting against the corresponding second contacts. Each second contact forms a second soldering section, a second retaining section for engaging with the housing, and a mating section for contacting with a mating plug terminal. The mating section of each second contact is configured to conform the configuration of the mating plug terminal thereby providing a good electrical contact therebetween. The engagement between the first and second contacts can occur before the mating plug terminal is inserted into the mating opening of the housing. Or, the engagement therebetween can occur after the insertion of the mating plug terminal.

1 Claim, 8 Drawing Sheets

SWITCHING RECEPTACLE CONNECTOR

FIELD OF THE INVENTION

The present invention relates to a receptacle connector, and particular to a switching receptacle connector comprising uniform switch contacts which have advantages of simple structures and convenient assembly thereby decreasing manufacturing costs thereof.

BACKGROUND OF THE INVENTION

Switching receptacle connectors, especially jack connectors, usually adopt various signal contacts and at least one grounding contact for achieving multi-channels sound or picture video/audio signal transmissions therethrough. Pertinent prior art can be referred to U.S. Pat. Nos. 5,022,872 and 5,893,767 as well as Taiwan patent application Nos. 85218465 and 82207507. As can be seen from these references, the configurations of the signal contacts of a conventional switching receptacle connector are commonly different from each other. Accordingly, a housing of the conventional switching receptacle connector should be formed to have receiving slots or grooves with different configurations for retaining the different signal contacts and the grounding contact therein, respectively. The complete structure of the switching receptacle connector is thus complicated. Moreover, the signal contacts and the grounding contact need to be assembled to the housing respectively. Consequently, the manufacturing process of the switching receptacle connector is complicated and the manufacturing cost thereof is increased. Furthermore, automatic mass production of the switching receptacle connector is difficult to be realized.

Another pertinent prior art can referred to U.S. Pat. No. 4,367,907. Three contact assemblies are disclosed in the '907 patent. Among them, two pairs of them are substantially the same. Each pair of the two pairs of the contact assemblies has a movable contact and a stationary contact. Each movable contact includes upper and lower spring elements integrally connected together by punching or welding in overlapping relationships. The movable contact and the stationary contact of a same pair each form a contacting portion for electrically contacting with each other before a plug is inserted therebetween. Another pair of the contact assembly also includes a movable contact and a stationary contact. The movable contact is different from the movable contacts of the former two pairs of the contact assemblies and forms a V-shaped element 61 for electrically contacting with the plug.

However, it is still difficult to realize mass-production which benefits reduced manufacturing costs thereof since the three pairs of the contact assemblies are not all the same and the structures of the contact assemblies are quite complicated. To the contrary, the complicated connections between the upper and lower spring elements of the movable contacts of the former two pairs will result in higher costs thereof.

Therefore, a switching receptacle connector with improved contacts design is desired.

BRIEF SUMMARY OF THE INVENTION

A main object of the present invention is to provide a switching receptacle connector having uniform contacts thereby simplifying manufacturing process thereof.

Another object of the present invention is to provide a switching receptacle connector having uniform contacts whose configuration is substantially in compliance with a mating terminal of a mating plug.

A switching receptacle connector in accordance with the present invention comprises an insulative housing and a plurality of pairs of switch contacts retained within the housing. The housing defines a longitudinal mating opening for extension of a mating plug terminal and a plurality of receiving slots in communication with the mating opening for receiving the corresponding switch contacts. Each contact pair includes a first contact and a second contact. Each first contact has a first soldering section for being surface mounted to a circuit board, a first retaining section for engaging with corresponding retaining slot of the housing, and an abutting section for abutting against the corresponding second contacts. Each second contact forms a second soldering section for being surface mounted to the circuit board, a second retaining section for engaging with a corresponding retaining slot of the housing, and a mating section for contacting with a mating plug terminal. The mating section of each second contact is configured to comply with the configuration of the mating plug terminal thereby providing a good electrical contact therebetween. The mating section of each second contact forms a contacting section for electrically engaging with the abutting section of a corresponding first contact. When the electrical engagement between the coupled first and second contacts occurs can be designed according to requirements. That is, the engagement between the first and second contacts can occur before the mating plug terminal is inserted into the mating opening of the housing. Or, the engagement therebetween can occur after the insertion of the mating plug terminal.

Other objects, advantages and novel features of the invention will become more apparent from the following detailed description when taken in conjunction with the accompanying drawings.

DETAILED DESCRIPTION OF THE INVENTION

Figure 1:
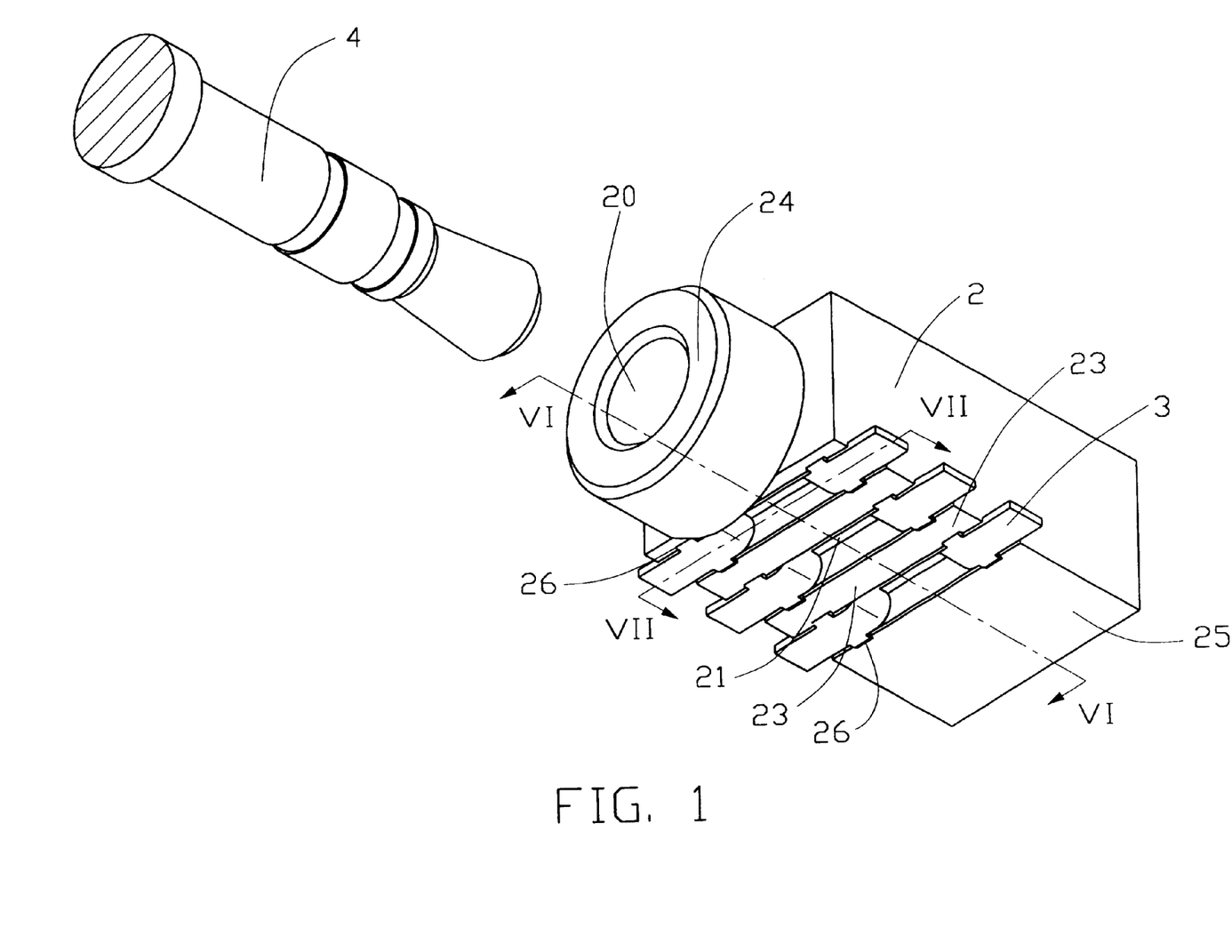
FIG. 1 is a perspective view of a switch receptacle connector in accordance with the present invention and a mating plug terminal.

Referring to FIG. 1, a switch receptacle connector 1 in accordance with the present invention comprises an insulative housing 2 and a plurality of pairs of contacts 3. Each pair of contacts 3 is substantially the same as other pair of contacts 3.

Figure 7:
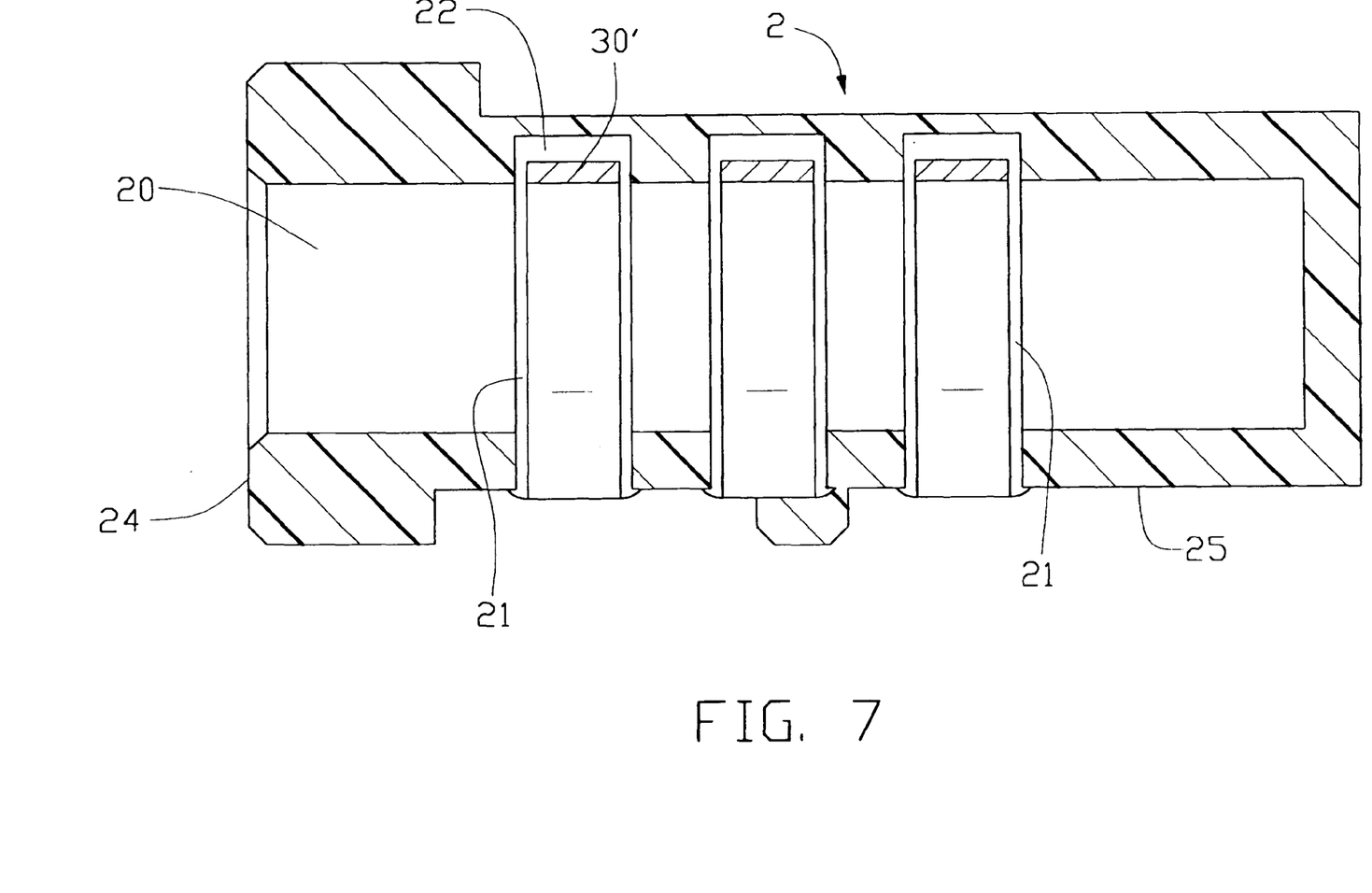
FIG. 7 is a cross-sectional view of a housing of FIG. 1.
Figure 8:
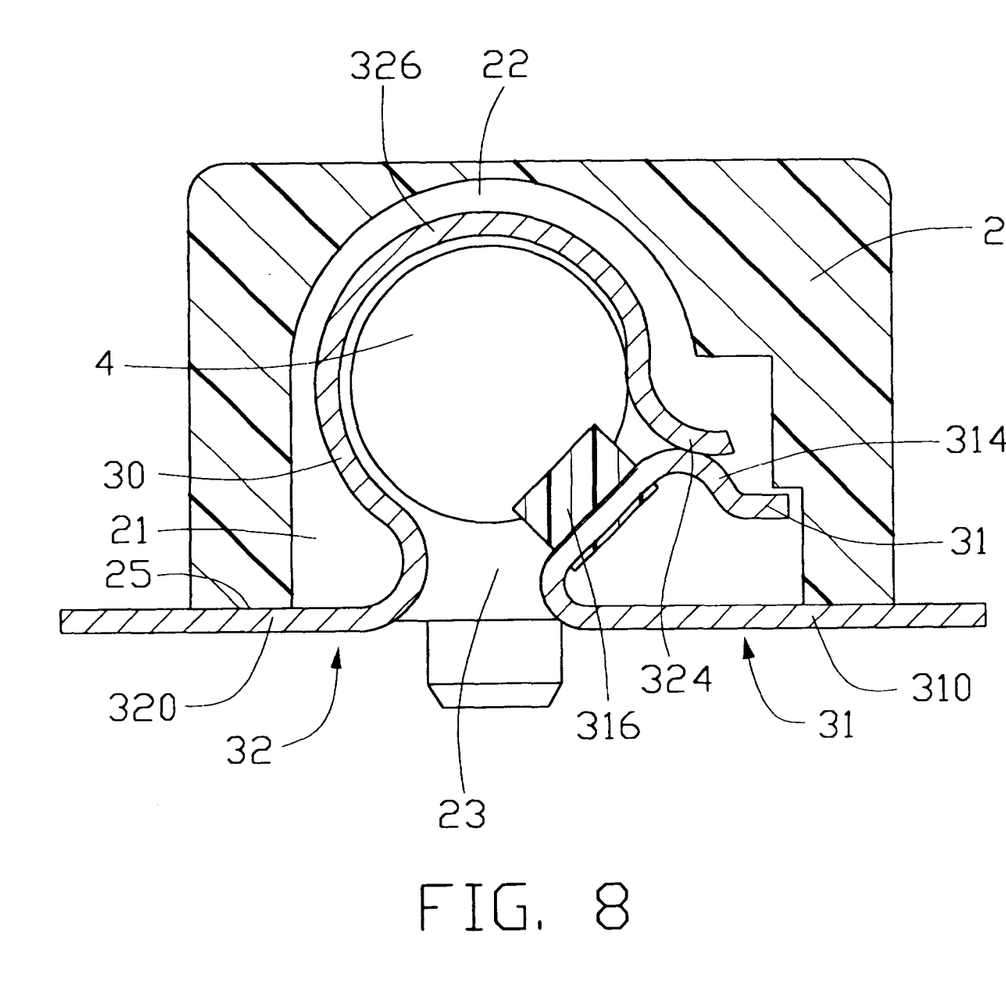
FIG. 8 is a cross-sectional view showing the engagement between the housing and a pair of first and second contacts.

Referring also to FIGS. 7 and 8, the housing 2 is substantially elongate and has a mating face 24 and a connecting face 25. A mating opening 20 is longitudinally defined in the housing 2 in communication with the mating face 24 for insertion of a mating plug terminal 4. A plurality of receiving grooves 21 is defined in the housing 2 in communication with the connecting face 25 and the mating opening 20, respectively. The contacts 3 are received in corresponding receiving grooves 21 of the housing 2. A plurality of retaining slots 26 is defined in the connecting face 25 of the housing 2 for engaging with corresponding retaining sections of the contacts 3 (detailed as below). Each receiving groove 21 is configured to comply with the configuration of a corresponding contact 3 and defines a deflecting space 22 for allowing the deflection of the corresponding contact 3 when the mating plug terminal 4 is inserted to mate with the contact 3.

Figure 2:
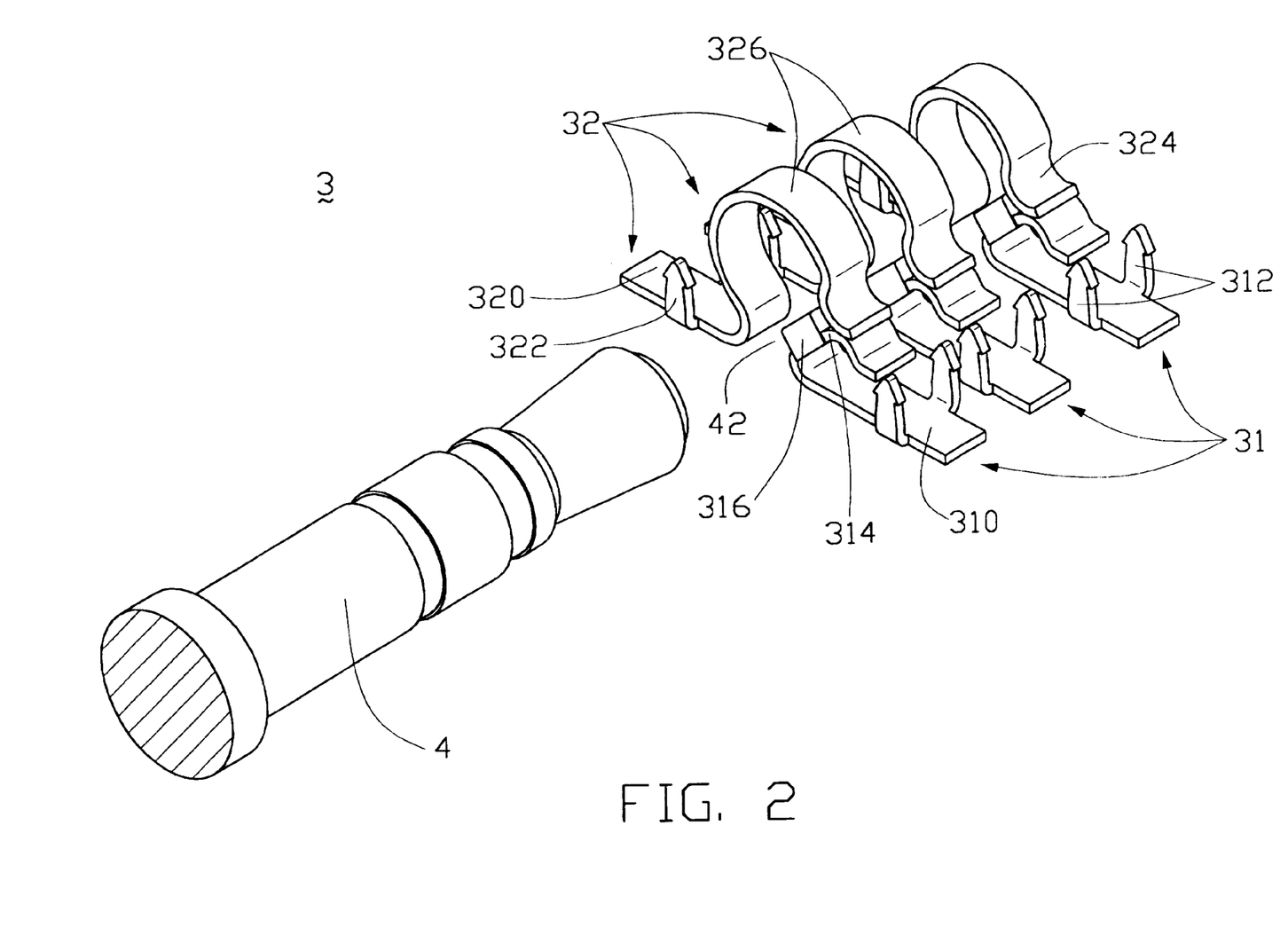
FIG. 2 is a perspective view of a plurality of pairs of first and second contacts of a first embodiment and the mating plug terminal of FIG. 1.
Figure 3:
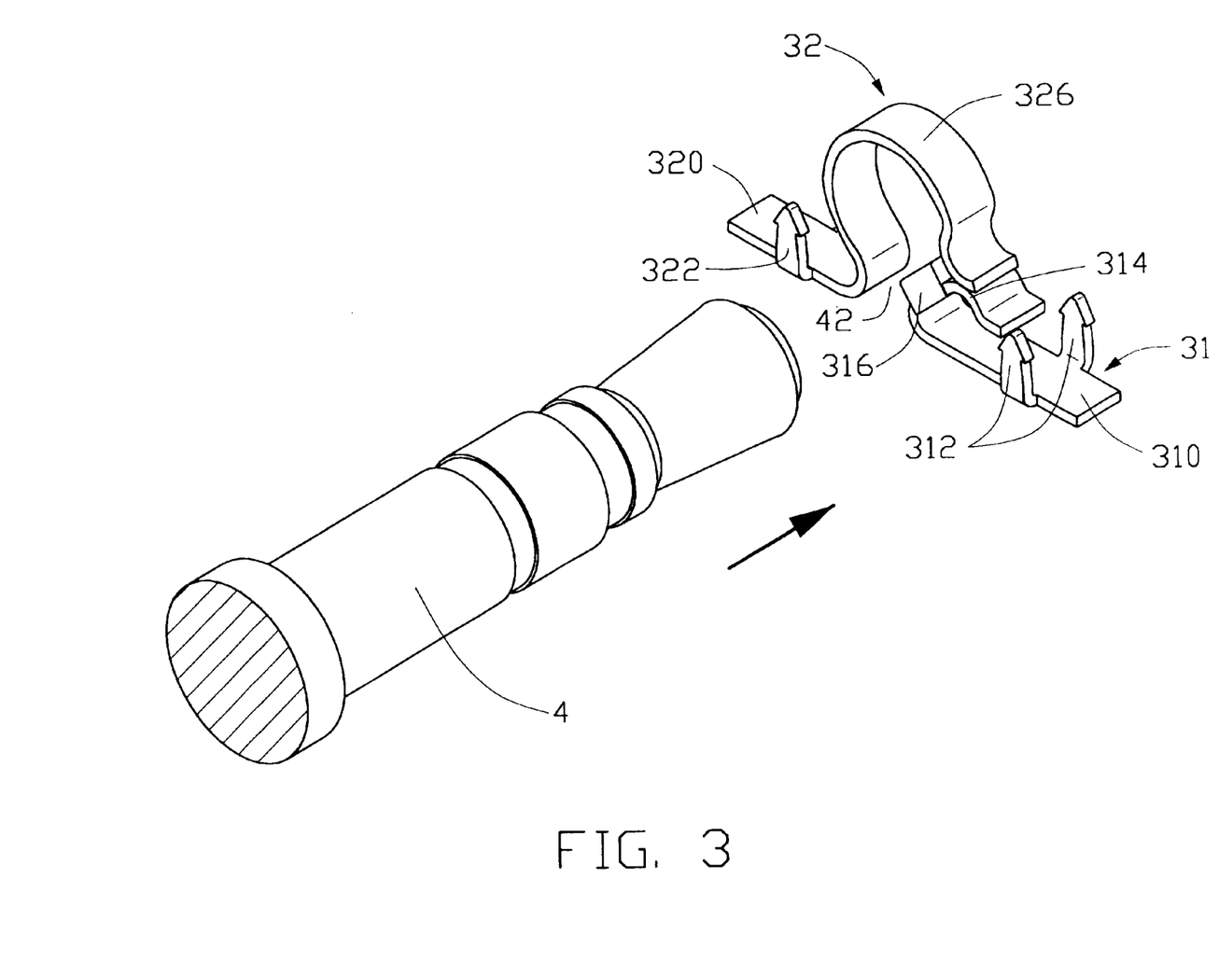
FIG. 3 is a perspective view showing a pair of first and second contacts and the mating plug terminal before engagement therebetween.
Figure 4:
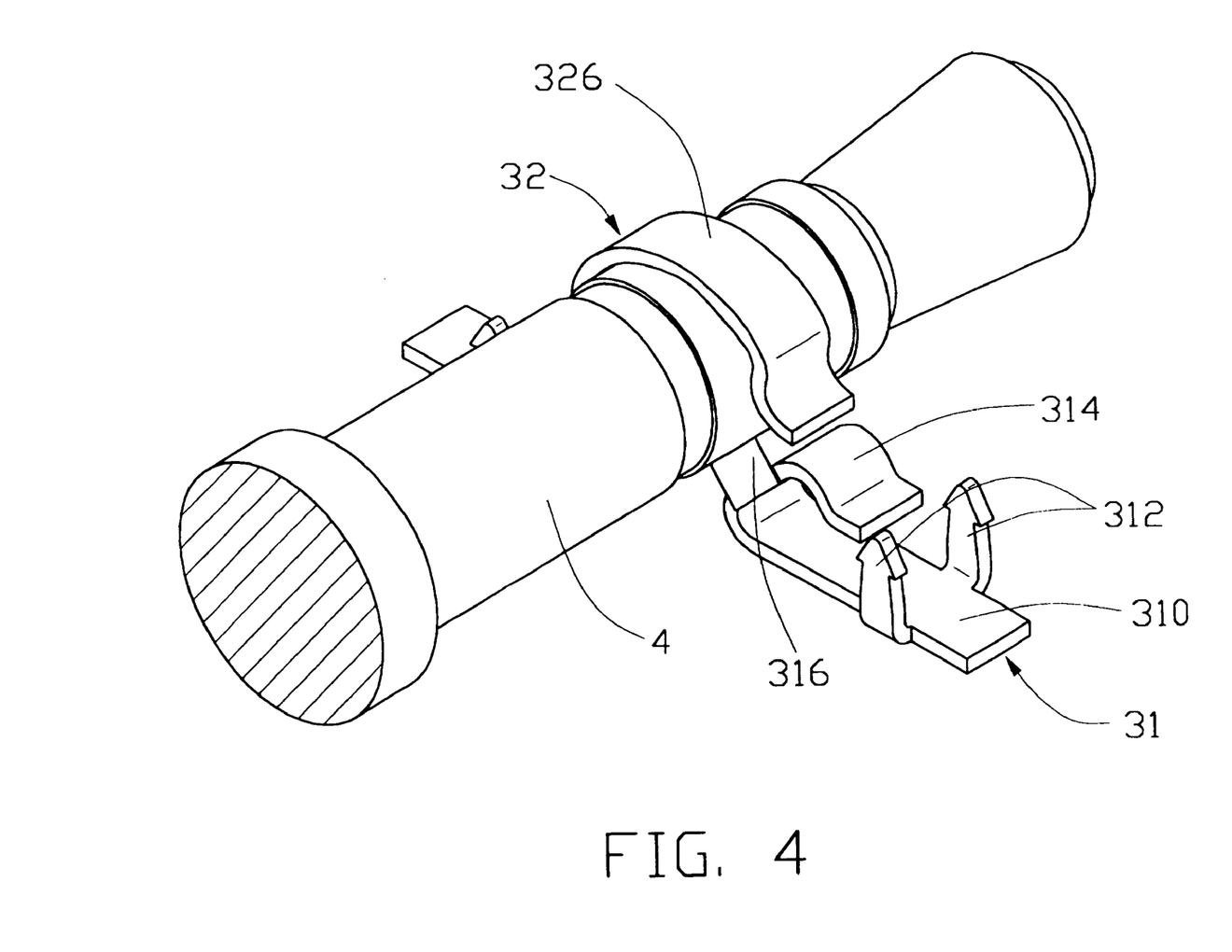
FIG. 4 is a perspective view showing the pair of first and second contacts and the mating plug terminal after engagement therebetween.

Referring further to FIGS. 2–4, a first embodiment in accordance with the present invention is shown. Each pair of contacts 3 is consisted of a first contact 31 and a second contact 32.

Each first contact 31 has a first soldering section 310 for being surface mounted to a circuit board (not shown), a pair of first retaining sections 312 extending from opposite sides of the first soldering section 310 for engaging with the corresponding engaging slots 26 of the housing 2, and a curved abutting section 314 extending from a free end of the first soldering section 310 for electrically engaging with the corresponding second contact 32. An insulator 316 is formed on a junction between the first soldering section 310 and the abutting section 314 of the first contact 31 for electrically separating the first contact 31 from the mating plug terminal 4.

Each second contact 32 includes a second soldering section 320 for being surface mounted to the circuit board, a pair of second retaining sections 322 perpendicularly extending from opposite sides of the second soldering section 320, and a curved mating section 326 extending from the second soldering section 320 for electrically engaging with the mating plug terminal 4. The configuration of the mating section 326 is substantially in compliance with that of the mating plug terminal 4 thereby ensuring good electrical signal transmission therebetween. A curved contacting section 324 is formed at a free distal of the mating section 326 of the second contact 32 for electrically abutting against the abutting section 314 of the first contact 31 thereby forming an electrical circuit therethrough.

In the first embodiment, the abutting section 314 of the first contact 31 electrically abuts against the contacting section 324 of the second contact 32 thereby forming a passage 42 before the mating plug terminal 4 is inserted into the passage 42 after extension into the mating opening 20 of the housing 2. When the mating plug terminal 4 is fitted into the passage 42 to electrically engage with the mating section 326 of the second contact 32, the engagement between the abutting section 314 of the first contact 31 and the contacting section 324 of the second contact 32 is broken owing to the deflection of the contacting section 326 of the second contact 32 by the mating plug terminal 4. Thus, the pair of first and second contacts 31, 32 performs the switch function as pre-determined.

Figure 5:
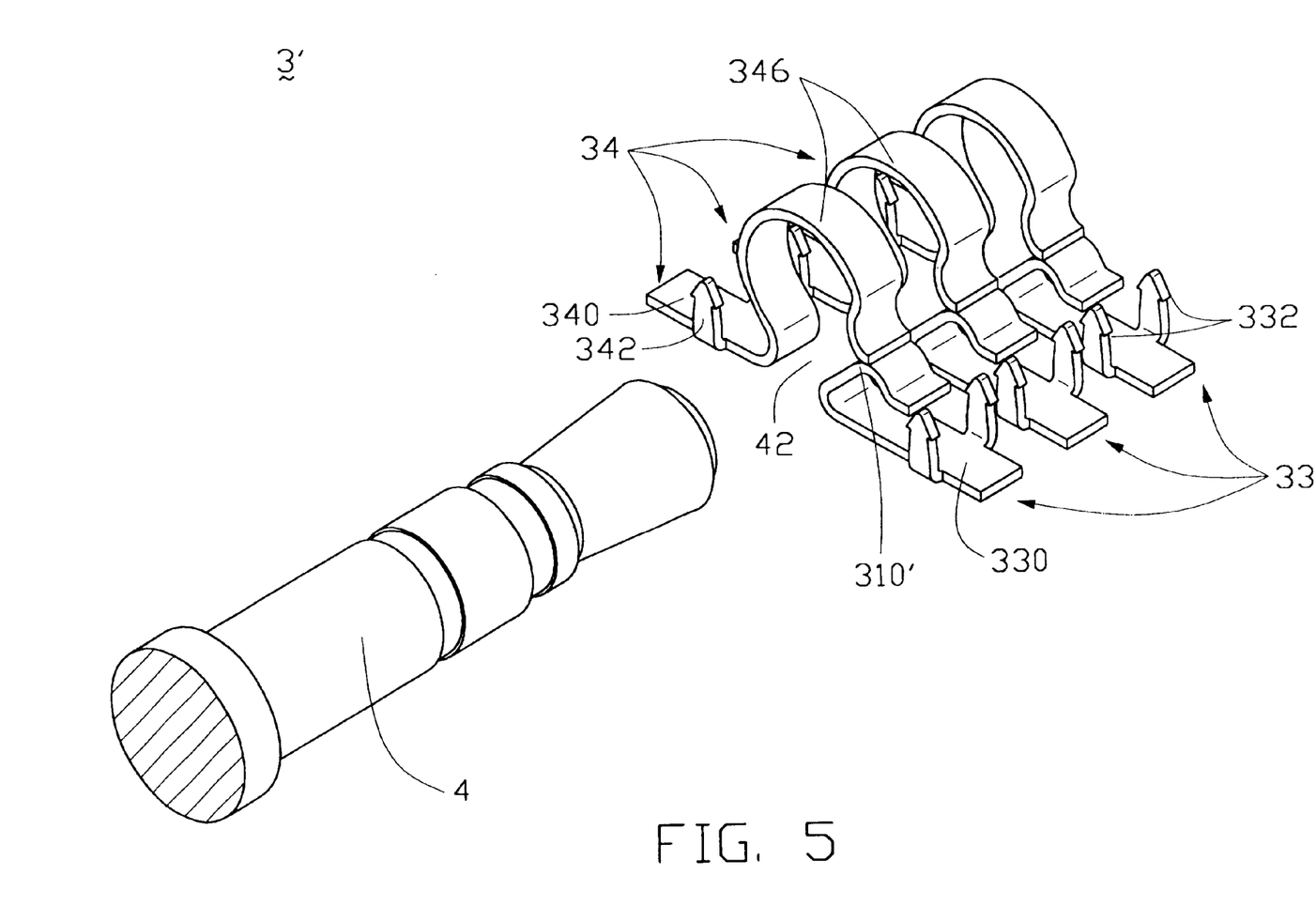
FIG. 5 is a perspective view of a pair of first and second contacts of a second embodiment.

In a second embodiment as shown in FIG. 5, another pair of first and second contacts 33, 34 is provided to embody the spirit of the present invention. The second contact 34 is substantially the same as the second contact 32 of the first embodiment as discussed above. The second contact 34 includes a second soldering section 340, a pair of second retaining sections 342 and a mating section 346. The first contact 33 is also substantially the same as the first contact 31 of the first embodiment except that no insulator is formed thereon. The first contact 33 forms a first soldering section 330, a pair of second retaining sections 332 and an abutting section 334.

The distinction between the first and second embodiments lies at the first and second contacts 33, 34 which do not electrically contact with each other before the mating plug terminal 4 is inserted to engage with the mating section 346 of the second contact 34. Electrical engagement between the first and second contacts 33, 34 in the second embodiment is established right after the insertion of the mating plug terminal 4.

Figure 6:
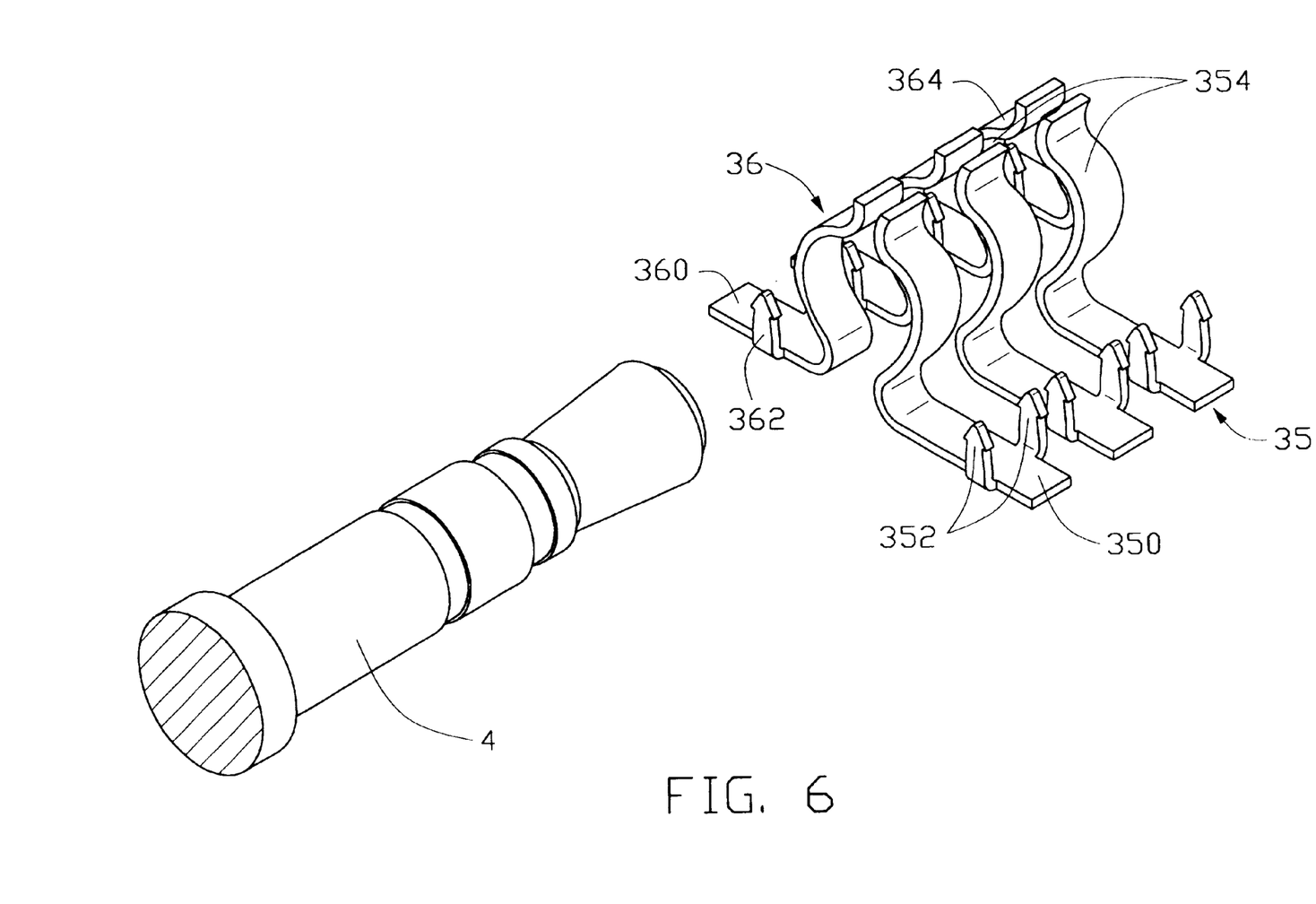
FIG. 6 is a perspective view of a plurality of pairs of first and second contacts of a third embodiment and the mating plug terminal of FIG. 1.

The same is the distinction between the first embodiment and a third embodiment as detailed below. Referring to FIG. 6, a third kind of pair of contact 3 is shown. The pair of contact 3 consists of a first contact 35 and a second contact 36. The first and second contact 35, 36 are substantially the same with each other. Each comprises a soldering section 350 and 360, a pair of retaining sections 352 and 362 extending from opposite sides of the soldering section 350 for engaging with the corresponding engaging slots 26 of the housing 2, and a mating section 354 and 364 for electrically contacting with the mating plug terminal 4. The mating sections 354, 364 of the first and second contacts 35, 36 form a passage 42 therebetween, which is configured to comply with the mating plug terminal 4. The first and second contacts 35, 36 establish electrical relationship therebetween via the mating plug terminal 4 right after the mating plug terminal 4 is inserted into the passage 42 to engage with the first and second contacts 35, 36.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A switching receptacle connector for mating with a plug having a plug terminal, comprising:

an insulative housing defining a mating opening and a plurality of receiving grooves in communication with the mating opening; and a plurality of substantially same pairs of first and second contacts, each pair of first and second contacts being received in corresponding receiving grooves of the housing, the first contact of each pair forming a first retaining section secured in the housing, the second contact of the same pair forming a second retaining section secured in the housing and a mating section for electrically connecting with the plug terminal of the plug to establish a desired relationship of electrical connection between the mating section of the second contact and the first contact;

wherein, before the plug terminal of the plug is inserted into the mating opening of the housing to electrically engage with the mating sections of the second contacts, the first and second contacts of each pair are electrically connected;

wherein each of the second contact forms a contacting section at a free distal end of the mating section for electrically contacting the respective first contact;

wherein the first contact of each pair forms an abutting section extending from the first soldering section for electrically contacting the contacting section of the respective second contact;

wherein an insulator is formed at a junction between the abutting section and the soldering section of each first contact for separating the first contact from the plug terminal of the plug when the plug terminal is inserted into the mating opening of the housing to electrically engage and to deflect the mating section of the respective second contact;

wherein each first contact forms an abutting section together with the mating section of the respective second contact to define a passage in conformity to the configuration of the plug terminal of the plug;

wherein the housing defines a pair of engaging slots proximate each receiving groove for engaging the retaining sections of the first and second contacts of each pair;

wherein each of the first and second contacts forms a soldering section;

wherein the soldering section of each of the first and second contacts is adapted to be surface mounted to a circuit board.

* * * * *